(12) United States Patent
Takeshima (10) Patent No.: US 8,648,455 B2
(45) Date of Patent: Feb. 11, 2014

(54) SEMICONDUCTOR DEVICE AND METHOD OF MANUFACTURING THE SAME

(75) Inventor: Hidehiro Takeshima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 93 days.

(21) Appl. No.: 13/150,674

(22) Filed: Jun. 1, 2011

(65) Prior Publication Data

US 2011/0291244 A1 Dec. 1, 2011

(30) Foreign Application Priority Data

Jun. 1, 2010 (JP) .................................. 2010-126078

(51) Int. Cl.
*H01L 23/02* (2006.01)
*H01L 29/06* (2006.01)
*H01L 23/34* (2006.01)
*H01L 23/48* (2006.01)
*H01L 23/52* (2006.01)

(52) U.S. Cl.
USPC ........... 257/686; 257/618; 257/777; 257/723; 257/774

(58) Field of Classification Search
USPC .......................... 257/618, 686, 777, 723, 678
See application file for complete search history.

(56) References Cited

U.S. PATENT DOCUMENTS

| 2006/0102992 | A1* | 5/2006 | Kwon et al. .................. 257/685 |
| 2008/0230888 | A1 | 9/2008 | Sasaki et al. |
| 2009/0224403 | A1 | 9/2009 | Fujii |
| 2011/0171777 | A1* | 7/2011 | Muto ............................ 438/107 |
| 2012/0267797 | A1* | 10/2012 | Haba et al. .................... 257/777 |

FOREIGN PATENT DOCUMENTS

| JP | 2004-296613 A | 10/2004 |
| JP | 2005-108962 A | 4/2005 |
| JP | 2005-340415 A | 12/2005 |
| JP | 2008-147226 A | 6/2008 |
| JP | 2008-235431 | 10/2008 |
| JP | 2009-212474 | 9/2009 |

OTHER PUBLICATIONS

Japanese Office Action issued in Japanese Application No. 2010-126078 dated Sep. 25, 2013.

* cited by examiner

*Primary Examiner* — Chuong A. Luu
(74) *Attorney, Agent, or Firm* — McDermott Will & Emery LLP (57) ABSTRACT

A semiconductor device includes a wiring substrate having an insulating film formed on a surface thereof, a first semiconductor chip mounted on the wiring substrate, and a second semiconductor chip stacked and mounted on the first semiconductor chip so as to form an overhang portion. The insulating film is removed from an area of the wiring substrate that faces the overhang portion.

20 Claims, 9 Drawing Sheets

SEMICONDUCTOR DEVICE AND METHOD OF MANUFACTURING THE SAME

This application is based upon and claims the benefit of priority from Japanese patent application No. 2010-126078, filed on Jun. 1, 2010, the disclosure of which is incorporated herein in its entirety by reference.

BACKGROUND OF THE INVENTION

1. Field of the Invention

The present invention relates to a semiconductor device and a method of manufacturing the same, and more particularly to a multi-chip package type semiconductor device in which a plurality of semiconductor chips are stacked on a wiring substrate and a method of manufacturing the same.

2. Description of the Related Art

For example, in multi-chip package (MCP) type semiconductor devices, a plurality of semiconductor chips are stacked on a wiring substrate. In some of those semiconductor devices, part of an upper semiconductor chip projects (overhangs) outward from a lower semiconductor chip. See, e.g., JP-A 2008-235431 (corresponding to US2008/0230888A1) and JP-A 2009-212474 (corresponding to US2009/0224403A1.)

SUMMARY

According to recent demands for reduction in size and thickness of potable devices or the like, it has been desired to reduce the thickness of semiconductor devices being used. In order to meet this requirement, the thickness of semiconductor chips has gradually been reduced. As a result, in a case of a semiconductor device including an upper semiconductor chip that overhangs a lower semiconductor chip, a gap between an overhang portion of the upper semiconductor chip and a wiring substrate has also been reduced.

In an MCP type semiconductor device, stacked semiconductor chips are sealed in a resin. If a gap between an overhang portion and a wiring substrate is reduced as described above, the fluidity of the sealing resin is lowered during a molding process. Therefore, the possibility of generation of voids is raised.

Thus, the existing semiconductor devices suffer from a problem that voids may be generated during a molding process.

The present invention seeks to solve one or more of the above problems, or to improve upon those problems at least in part.

In one embodiment, a semiconductor device, comprising:
a wiring substrate;
an insulating film formed on the wiring substrate;
a first semiconductor chip mounted over the wiring substrate; and
a second semiconductor chip stacked on the first semiconductor chip so as to form an overhang portion;
wherein the insulating film is removed from an area of the wiring substrate that faces the overhang portion.

In another embodiment, a method of manufacturing a semiconductor device, comprising:
forming an insulating film on an entire surface of a wiring substrate;
partially removing the insulating film from a predetermined area;
mounting a first semiconductor chip over the wiring substrate so that the first semiconductor chip is adjacent to the predetermined area;
stacking and mounting a second semiconductor chip on the first semiconductor chip so that part of the second semiconductor chip projects from the first semiconductor chip and faces at least part of the predetermined area; and
sealing the first semiconductor chip and the second semiconductor chip on the wiring substrate in a sealing resin.

BRIEF DESCRIPTION OF THE DRAWINGS

The above features and advantages of the present invention will be more apparent from the following description of certain preferred embodiments taken in conjunction with the accompanying drawings, in which.

DESCRIPTION OF EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

Figure 1:
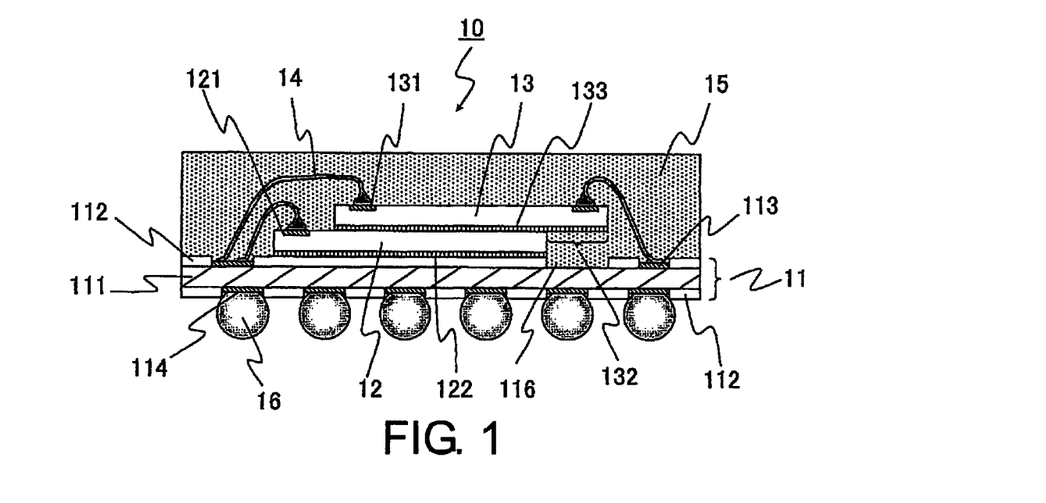
FIG. 1 is a cross-sectional view schematically showing a semiconductor device according to a first embodiment of the present invention.
Figure 2:
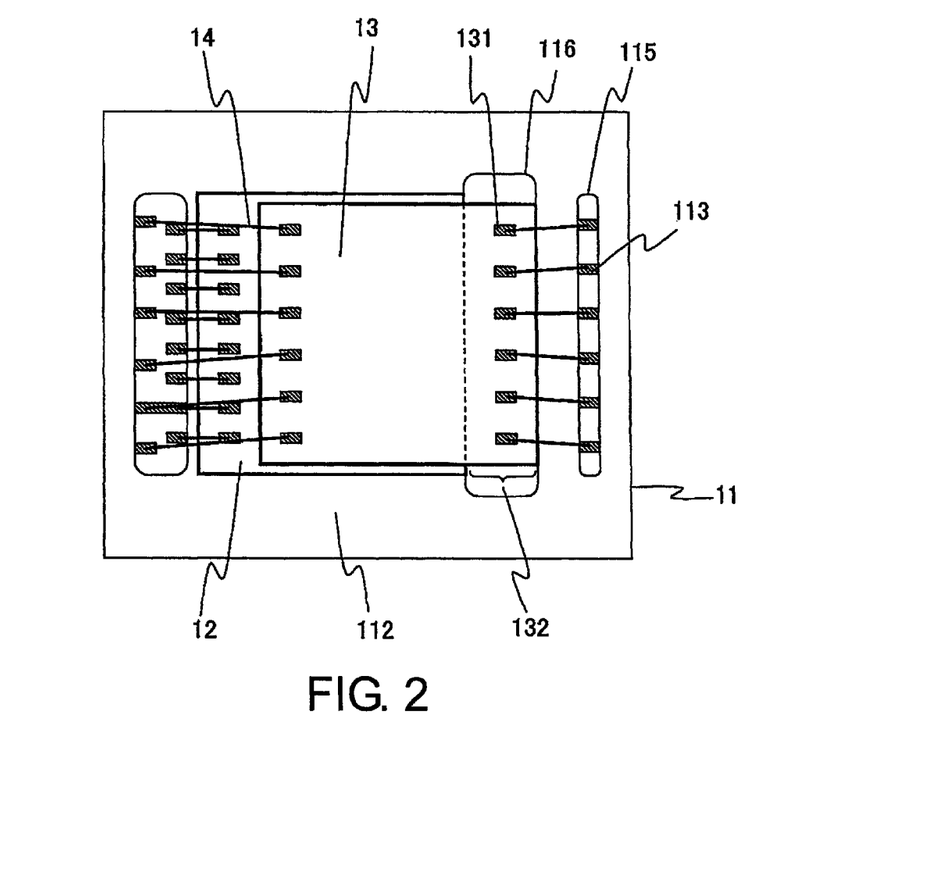
FIG. 2 is a cross-sectional view schematically showing the semiconductor device according to the first embodiment of the present invention.

FIGS. 1 and 2 are a cross-sectional view and a plan view schematically showing a semiconductor device according to a first exemplary embodiment of the present invention. In the plan view of FIG. 2, a sealing resin (denoted by the reference numeral 15 in FIG. 1) is omitted from the illustration.

The illustrated semiconductor device 10 includes a wiring substrate 11, a first semiconductor chip 12, a second semiconductor chip 13, wires 14, a sealing resin 15, and solder balls 16.

For example, the wiring substrate 11 is formed of a glass epoxy substrate substantially in the form of a rectangular plate. The wiring substrate 11 includes an insulating substrate 111, wiring layers (not shown) patterned on both sides of the insulating substrate 111, and insulating films 112 formed so as to cover the wiring layers. A plurality of connection pads 113 are formed on and connected to the wiring layer formed on a first surface of the wiring substrate 11. Furthermore, a plurality of land portions 114 are formed on and connected to the wiring layer formed on a second surface of the wiring substrate 11. As shown in FIG. 2, the connection pads 113 are arranged on the first surface of the wiring substrate 11 near the peripheral portion of the wiring substrate 11. Furthermore, the land portions 114 are arranged in a grid pattern on the second surface of the wiring substrate 11. The connection pads 113 and the land portions 114 are connected to each other by wires connected to the connection pads 113 and the land portions 114, vias extending through the insulating substrate 111, and the like. The wires 14 are connected to the connection pads 113. The solder balls 16 are mounted on the land portions 114.

For example, the insulating films 112 are formed of a solder resist (SR). The insulating films 112 are formed entirely on both surfaces of the insulating substrate 111 except predetermined areas. In other words, part of the insulating films 112 has been removed from the predetermined areas so that the insulating films 112 have one or more opening portions. For example, opening portions 115 and 116 are formed on the first surface of the wiring substrate 11. The opening portions 115 expose an area in which the connection pads 113 are formed and the vicinity thereof. The opening portion 116 exposes an area that faces an overhang portion (132) of the second semiconductor chip 13, which will be described later, or an area broader than the area that faces the overhang portion 132 of the second semiconductor chip 13. Opening portions for exposing the land portions 114 are formed on the second surface of the wiring substrate 11.

The first semiconductor chip 12 is substantially in the form of a rectangular plate. Some circuits and electrode pads 121 are formed on a first surface of the first semiconductor chip 12. The electrode pads 121 are arranged along one side of the first semiconductor chip 12.

The first semiconductor chip 12 is mounted on the first surface of the wiring substrate 11 near the center of the wiring substrate 11 and located at a position deviated leftward from the center of the wiring substrate 11 in FIG. 2. Specifically, the first semiconductor chip 12 is arranged adjacent to the opening portion 116 so that one side of the first semiconductor chip 12 overlies one side of the opening portion 116. A second surface of the first semiconductor chip 12 is bonded and fixed to a portion of the wiring substrate 11 in which the insulating film 112 has been formed by an adhesive member 122 such as a die-attach film (DAF).

The second semiconductor chip 13 is substantially in the form of a rectangular plate as with the first semiconductor chip 12. Some circuits and electrode pads 131 are formed on a first surface of the second semiconductor chip 13. The electrode pads 131 are arranged along opposite sides of the second semiconductor chip 13.

The second semiconductor chip 13 is stacked and mounted on the first semiconductor chip 12 such that the corresponding sides of the first semiconductor chip 12 and the second semiconductor chip 13 are in parallel to each other. The second semiconductor chip 13 is deviated rightward from the first semiconductor chip 12 so as not to cover an area of the first semiconductor chip 12 in which the electrode pads 121 are formed. As a result, part of the second semiconductor chip 13 projects outward from the first semiconductor chip 12 and thus forms an overhang portion 132. In this example, the second semiconductor chip 13 is arranged so as to project in a direction perpendicular to one side of the first semiconductor chip 12. A second surface of the second semiconductor chip 13 is bonded and fixed to the first semiconductor chip 12 by an adhesive member 133 such as a die-attach film (DAF).

The circuit configurations and functions of the first semiconductor chip 12 and the second semiconductor chip 13 do not directly relate to the present invention. The number and arrangement of the electrode pads are not limited to the illustrated example. For example, the first semiconductor chip 12 and the second semiconductor chip 13 may have the same configuration.

For example, the wires 14 are formed of a conductive metal such as Au. The wires 14 electrically connect between the electrode pads 121 or 131 and the corresponding connection pads 113.

The sealing resin 15 is formed of an insulating resin. The first semiconductor chip 12, the second semiconductor chip 13, and the wires 14 are sealed in the sealing resin 15 so that the sealing resin 15 covers the first surface of the wiring substrate 11. In the present embodiment, the insulating film 112 is not formed in the area that faces the overhang portion 132 of the second semiconductor chip 13 (the insulating film 112 has been removed from that area). Therefore, a larger gap is produced between the overhang portion 132 of the second semiconductor chip 13 and the wiring substrate 11 as compared to a case where the insulating film 112 has been formed in that area. Accordingly, the fluidity of a material resin can be improved between the overhang portion 132 of the second semiconductor chip 13 and the wiring substrate 11 during a molding process of forming the sealing resin 15. Thus, generation of voids can be prevented or suppressed.

The resin can more effectively be filled into between the overhang portion 132 and the wiring substrate 11 by making the two-dimensional shape of the opening portion 116 wider than the two-dimensional shape of the overhang portion 132, particularly in a direction of injection of the sealing resin (the longitudinal direction of FIG. 2).

When the insulating substrate 111 is formed of glass epoxy, the adhesiveness between the sealing resin 15 and the insulating substrate 111 is higher than the adhesiveness between the sealing resin 15 and the insulating film (SR) 112. Therefore, the wiring substrate 11 of this embodiment has a larger contact area between the sealing resin 15 and the insulating substrate 111 and a higher adhesive strength to the sealing resin 15 as compared to a wiring substrate in which the insulating film 112 is formed in an area that faces the overhang portion 132 of the second semiconductor chip 13. Accordingly, the possibility of separation of the sealing resin 15 between the overhang portion 132 and the wiring substrate 11 can be reduced, so that the reliability of the semiconductor device can be improved.

Next, a method of manufacturing the semiconductor device 10 will be described.

Figure 3:
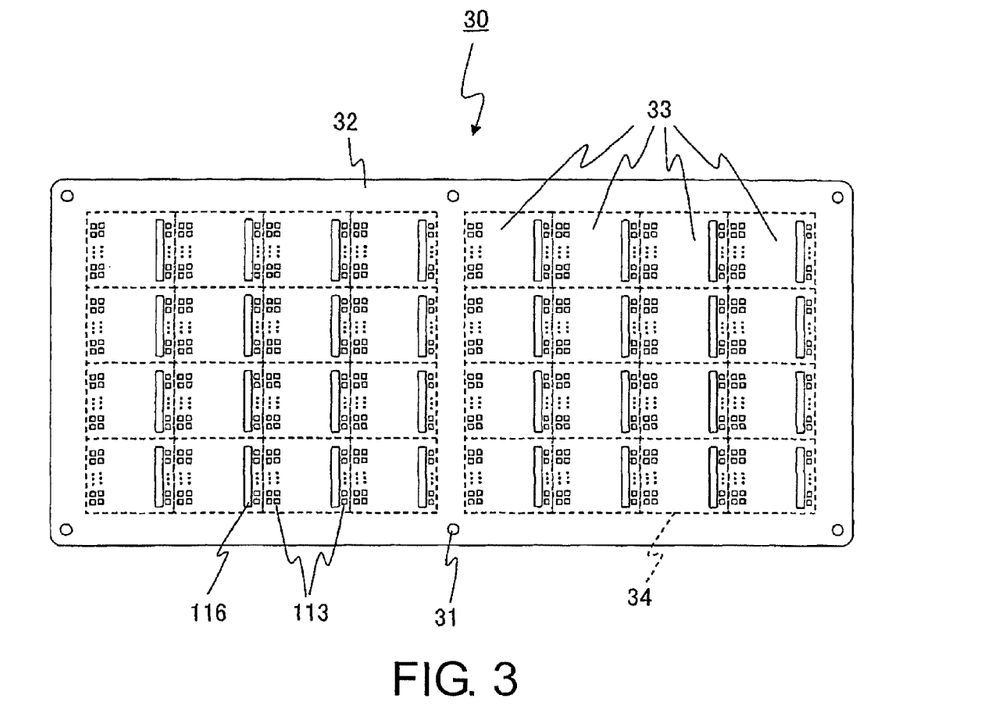
FIG. 3 is a plan view schematically showing a base wiring substrate used to manufacture the semiconductor device shown in FIGS. 1 and 2.

FIG. 3 is a plan view schematically showing a base wiring substrate 30 used to manufacture the semiconductor device 10.

The base wiring substrate 30 includes a plurality of product formation portions 33 in an area surrounded by a frame portion 32, which has positioning holes 31 formed therein. The product formation portions 33 are arranged like a matrix. A plurality of connection pads 113 and an opening portion 116 are formed in each of the product formation portions 33. The opening portion 116 is formed so as to extend along a direction of injection of a sealing resin (the longitudinal direction in FIG. 3). Those product formation portions 33 are individually cut along dicing lines 34 to thereby produce a plurality of wiring substrates 11.

Figure 4:
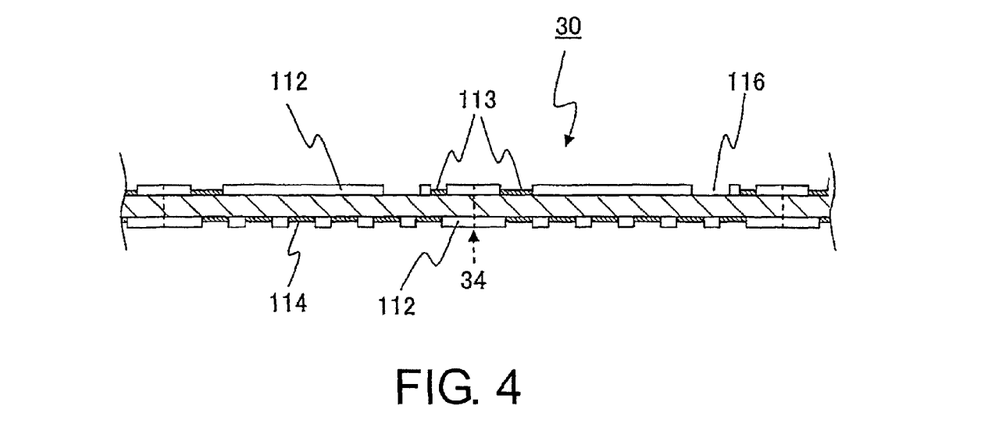
FIG. 4 is an enlarged cross-sectional view of the base wiring substrate shown in FIG. 3.

FIG. 4 is an enlarged cross-sectional view of the base wiring substrate 30. As shown in FIG. 4, insulating films 112 are formed on both surfaces of the base wiring substrate 30. The insulating films 112 have opening portions 116 each surrounding an area that is to face an overhang portion 132 as well as opening portions for exposing connection pads 113 and land portions 114.

For example, the insulating films 112 are formed by applying a material for the insulating films to entire surfaces of the base wiring substrate 30 and hardening the material through drying and exposure. Portions of the insulating films 112 that correspond to the opening portions are not subject to the exposure and are removed by subsequent development.

It is preferable to provide no wiring pattern in the opening portions 116. If a wiring pattern is provided in the opening portions 116, it is preferable to plate a surface of the wiring pattern with Ni and Au as in the case of the connection pads 113. The reliability of wiring can be maintained with the plated surface even though the wiring pattern is not covered with the insulating film 112.

Next, a method of manufacturing the semiconductor device 10 with use of the base wiring substrate 30 will be described with reference to FIGS. 5A to 5E.

Figure 5A:
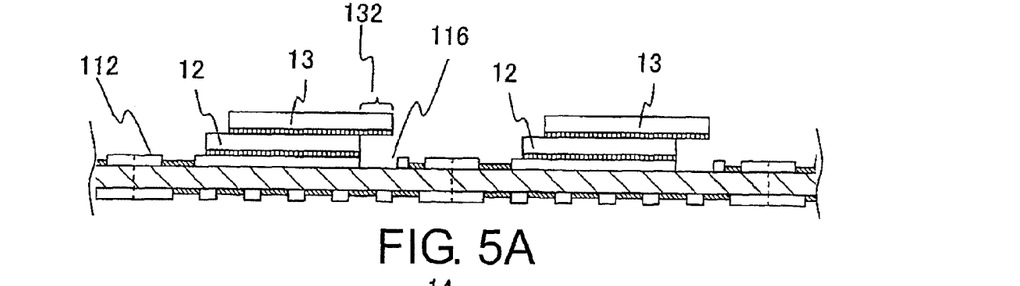
FIG. 5A is a process diagram showing a manufacturing process of the semiconductor device shown in FIGS. 1 and 2.

First, as shown in FIG. 5A, first semiconductor chips 12 and second semiconductor chips 13 are sequentially mounted on the base wiring substrate 30 shown in FIG. 4. Each of the first semiconductor chips 12 is mounted adjacent to the corresponding opening portion 116 so that one side of the first semiconductor chip 12 overlies one side of the corresponding opening portion 116. The first semiconductor chips 12 are bonded and fixed to the base wiring substrate 30 by an adhesive member 122 such as DAF provided on the second surfaces of the first semiconductor chips 12. Similarly, the second semiconductor chips 13 are bonded and fixed to the first surfaces of the first semiconductor chips 12 by an adhesive member 122 such as DAF provided on the second surfaces of the second semiconductor chips 13.

The second semiconductor chips 13 are stacked so as to expose the electrode pads 121 of the first semiconductor chips 12. Additionally, the second semiconductor chips 13 are arranged such that the overhang portion 132 of each of the second semiconductor chips 13 is located right above at least part of the corresponding opening portion 116. In this case, the overhang portion 132 of each of the second semiconductor chips 13 projects from the first semiconductor chip 12 in a direction perpendicular to the direction of injection of the sealing resin (rightward in FIG. 5A).

Since the overhang portion 132 is located right above an area of the corresponding opening portion 116, a distance between the overhang portion 132 and the base wiring substrate 30 opposed to the overhang portion 132 can be increased by the thickness of the insulating film 112. Therefore, a subsequent filling process of the sealing resin is facilitated.

Figure 5B:
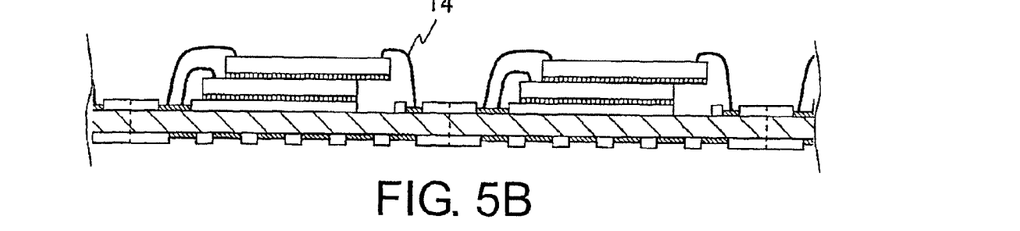
FIG. 5B is a process diagram showing a manufacturing process of the semiconductor device shown in FIGS. 1 and 2.
Figure 6:
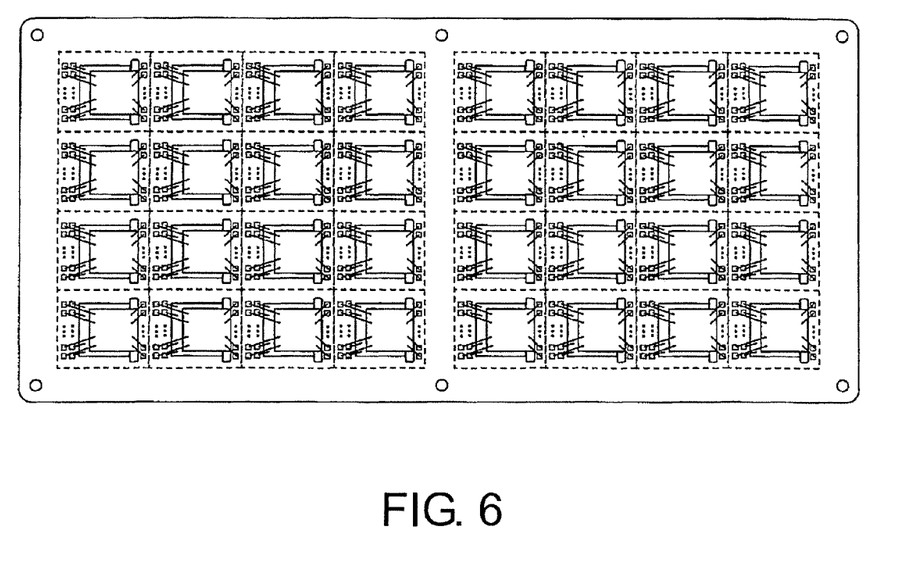
FIG. 6 is a plan view of the base wiring substrate after the process of FIG. 5B.

Next, as shown in FIG. 5B, the electrode pads 121 of the first semiconductor chips 12 and the corresponding connection pads 113 are connected to each other by wires 14, and the electrode pads 131 of the second semiconductor chips 13 and the corresponding connection pads 113 are connected to each other by wires 14. For example, the wires 14 are made of Au. A wire bonding apparatus (not shown) may be used to connect the wires 14. For example, the wire connection is performed by ball bonding that uses an ultrasonic thermo-compression bonding method. Specifically, an end of a wire 14 where a ball has been formed by fusion is bonded to the electrode pad 121 or 131 by an ultrasonic thermo-compression bonding method. Another end of the wire 14 is bonded to the corresponding connection pad 113 by an ultrasonic thermo-compression bonding method so that the wire 14 draws a predetermined loop shape. FIG. 6 is a plan view of the base wiring substrate 30 after the process shown in FIG. 5B.

Figure 5C:
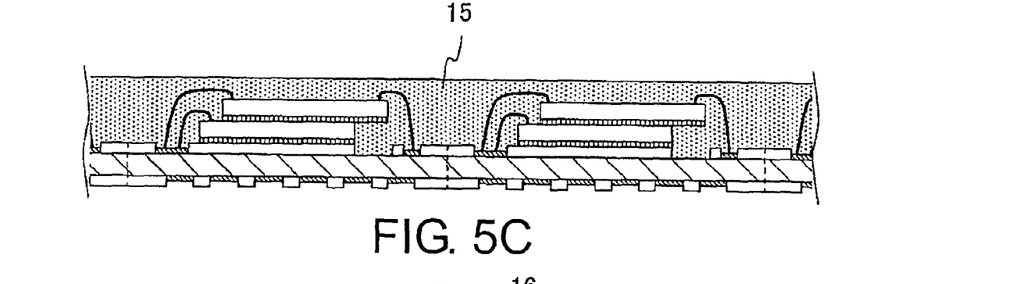
FIG. 5C is a process diagram showing a manufacturing process of the semiconductor device shown in FIGS. 1 and 2.

Then, as shown in FIG. 5C, a sealing resin 15 is formed on the first surface of the base wiring substrate 30 by bulk molding. The bulk molding will be described later with reference to FIG. 7.

Figure 5D:
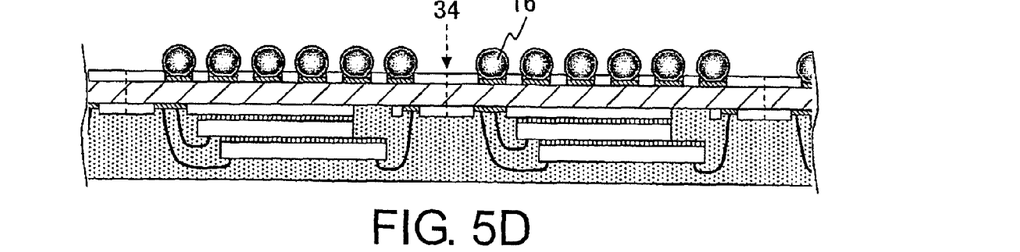
FIG. 5D is a process diagram showing a manufacturing process of the semiconductor device shown in FIGS. 1 and 2.

Subsequently, as shown in FIG. 5D, a solder ball 16 is mounted onto each of the land portions 114 on the second surface of the base wiring substrate 30. The solder balls 16 are used as external terminals of the semiconductor device 10.

The solder balls 16 are mounted with a suction mechanism (not shown) having a plurality of suction holes arranged so as to correspond to the land portions 114. In this case, a plurality of solder balls are attracted and held by the suction mechanism, a flux is transferred to the solder balls being held. The solder balls are collectively mounted on the land portions 114 of the base wiring substrate 30. Then the solder balls and the land portions 114 are connected and fixed to each other by a reflow process.

Figure 5E:
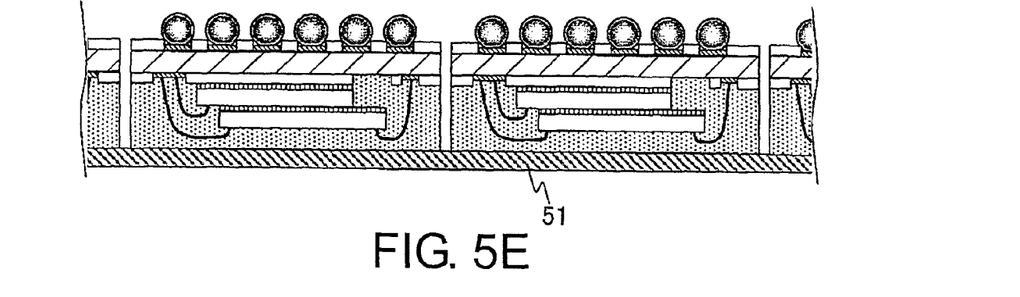
FIG. 5E is a process diagram showing a manufacturing process of the semiconductor device shown in FIGS. 1 and 2.

Then, as shown in FIG. 5E, the sealing resin 15 is bonded to a dicing tape 51. Thus, the sealing resin 15 and the base wiring substrate 30 are supported by the dicing tape 51. Thereafter, the base wiring substrate 30 and the sealing resin 15 are cut lengthwise and breadthwise along the dicing lines 34. As a result, the base wiring substrate 30 is divided into individual product formation portions 33. The semiconductor device 10 as shown in FIG. 1 is obtained by picking up one of the divided product formation portions 33 and sealing resins 15.

Figure 7A:
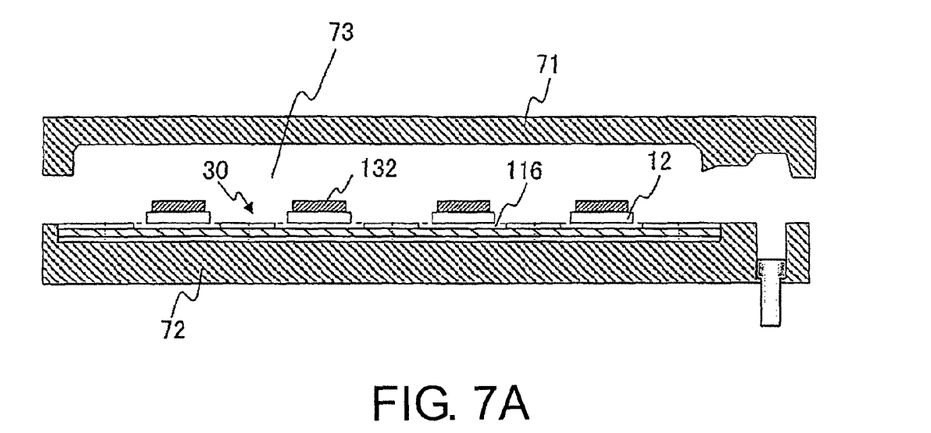
FIG. 7A is a process diagram explanatory of a molding process included in the process of FIG. 5C.
Figure 7B:
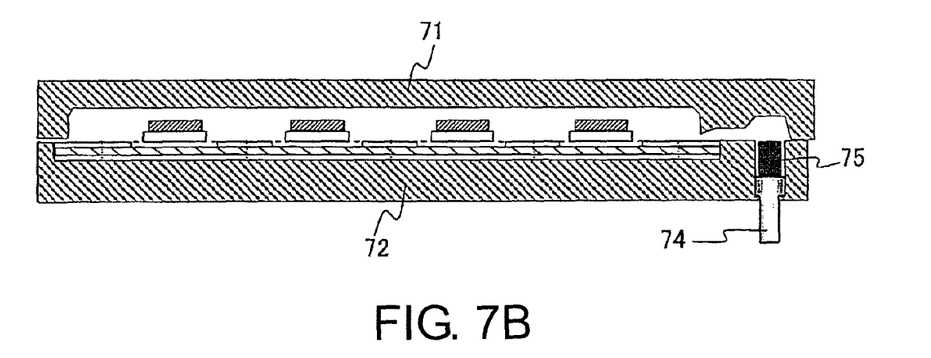
FIG. 7B is a process diagram explanatory of the molding process included in the process of FIG. 5C.
Figure 7C:
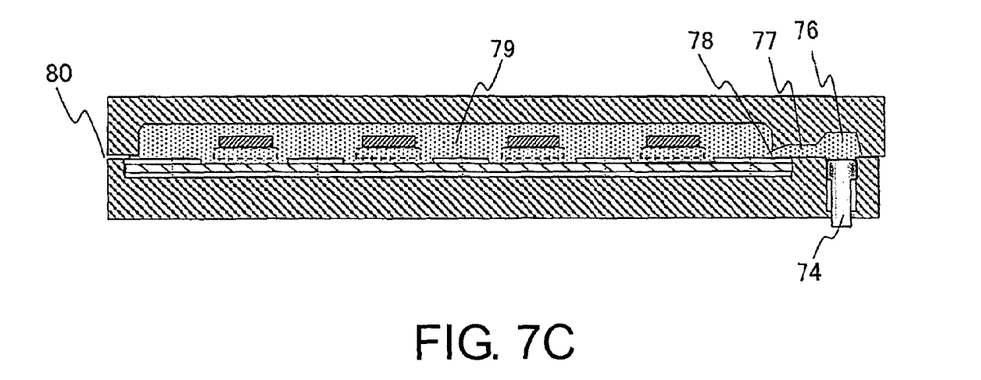
FIG. 7C is a process diagram explanatory of the molding process included in the process of FIG. 5C.

Next, the bulk molding for forming the sealing resin 15 will be described below with reference to FIGS. 7A to 7C. FIGS. 7A to 7C show a cross-section taken along a line that is parallel to the longitudinal direction of FIG. 6 and passes through the overhang portions 132.

For example, a transfer mold apparatus is used for the bulk molding.

First, as shown in FIG. 7A, the base wiring substrate 30 on which the process of connecting the wires 14 has been completed is placed within a cavity 73 of a transfer mold apparatus, which is formed by an upper mold 71 and a lower mold 72.

Then, as shown in FIG. 7B, material tablets 75 such as thermosetting epoxy resin are set on plungers 74. The upper mold 71 and the lower mold 72 are clamped.

Thereafter, as shown in FIG. 7C, the material tablets 75 are compressed and melted by the plungers 74, so that a melted resin 79 is press-fitted into the cavity 73 from culls 76 through runners 77 and gates 78. The melted resin flows from the gates 78 to an air vent 80, i.e., from the right side to the left side of FIG. 7C.

Figure 8:
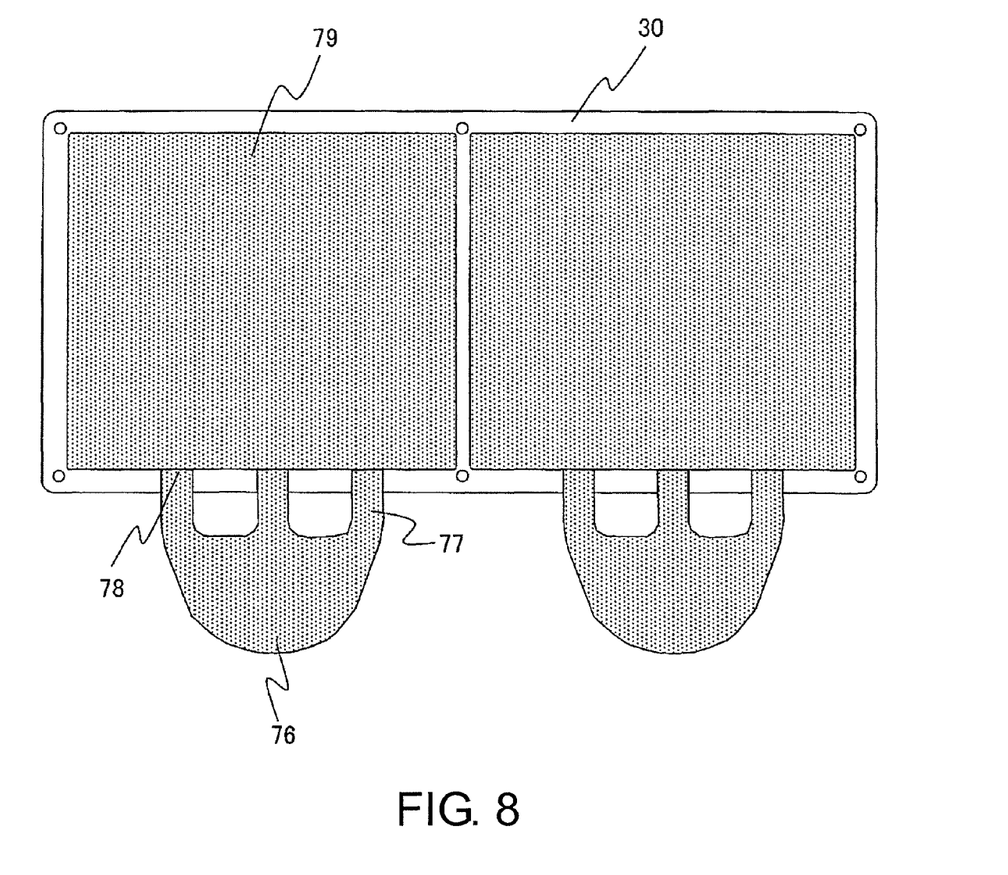
FIG. 8 is a plan view explanatory of a flow of a melted resin during the molding process.

FIG. 8 is a plan view of the melted resin 79 filled in the cavity 73. The melted resin 79 flows from the culls 79, which are illustrated at a lower portion of FIG. 8, through the runners 77 and the gates 78 into the cavity 73. The melted resin 79 moves substantially straight from the lower side toward the upper side of FIG. 8.

Referring back to FIG. 7C, the overhang portions 132 project from the rear side toward the front side of the paper. The direction in which the overhang portions 132 project is substantially perpendicular to the direction in which the melted resin 79 flows. Furthermore, a side of each of the first semiconductor chips 12 that is adjacent to the corresponding opening portion 116 is substantially in parallel to the direction in which the melted resin 79 flows. In other words, gaps between the overhang portions 132 and the base wiring substrate 30 is arranged along the direction in which the melted resin 79 flows. As a result, there is found little cause for preventing a flow of the melted resin 79 into between the overhang portions 132 and the base wiring substrate 30 and a flow of the melted resin 79 from between the overhang portions 132 and the base wiring substrate 30. Therefore, the inflow and outflow of the melted resin 79 are facilitated. Furthermore, since the insulating film 112 is not provided (or has been removed) right below the overhang portions 132, wide gaps are formed between the overhang portions 132 and the base wiring substrate 30, so that the melted resin 79 has a high fluidity. Accordingly, generation of voids can be prevented between the overhang portions 132 and the base wiring substrate 30 during the molding process.

Second Exemplary Embodiment

Figure 9:
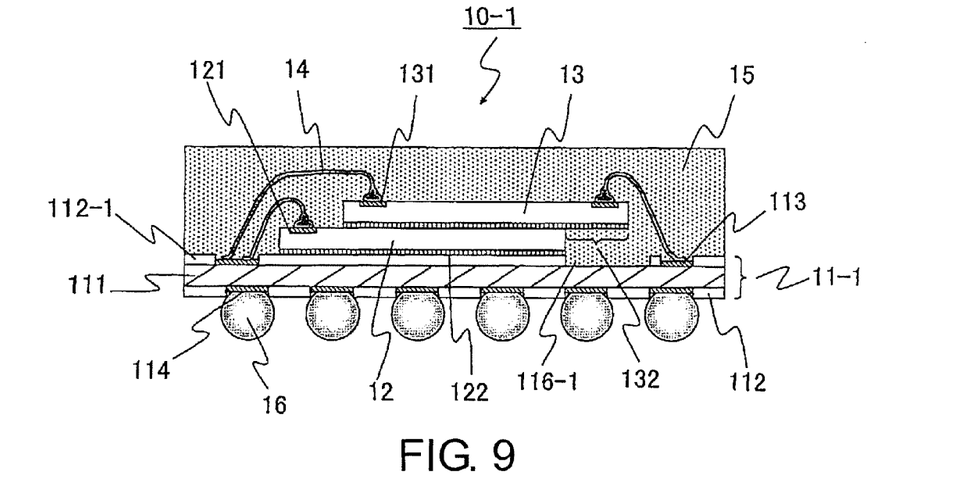
FIG. 9 is a cross-sectional view schematically showing a semiconductor device according to a second embodiment of the present invention.
Figure 10:
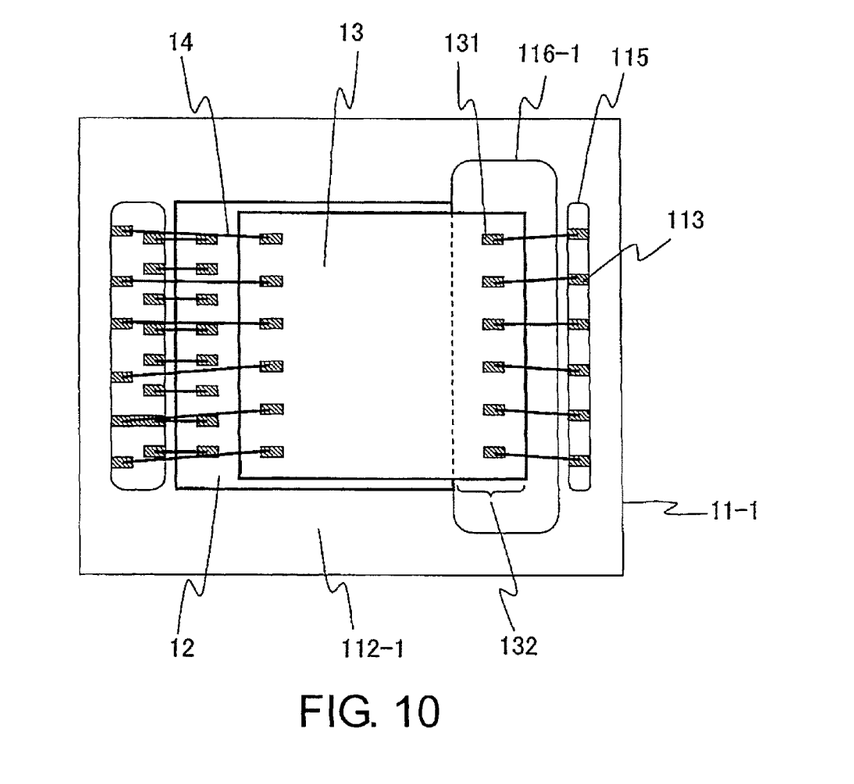
FIG. 10 is a plan view schematically showing the semiconductor device according to the second embodiment of the present invention.

FIGS. 9 and 10 are a cross-sectional view and a plan view schematically showing a semiconductor device 10-1 according to a second exemplary embodiment of the present invention. In this exemplary embodiment, the same elements as in the semiconductor device 10 of the first exemplary embodiment are denoted by the same reference numerals, and the explanation thereof is omitted herein.

The semiconductor device 10-1 has substantially the same configuration as the semiconductor device 10 of the first embodiment. However, the semiconductor device 10-1 differs from the semiconductor device 10 of the first embodiment in that an insulating film 112-1 of a wiring substrate 11-1 has an opening portion 116-1 that is larger than the opening portion 116 of the insulating film 112.

The opening portion 116-1 is larger than the opening portion 116 not only in a direction parallel to the side of the first semiconductor chip 12 that is adjacent to the opening portion 116-1 (the longitudinal direction of FIG. 10), but also in a direction perpendicular to the direction parallel to the side of the first semiconductor chip 12 that is adjacent to the opening portion 116-1 (the rightward direction of FIG. 10). In other words, the opening portion 116-1 is larger than the opening portion 116 not only in a direction of injection of the sealing resin 15, but also in a direction in which the overhang portion 132 projects.

With the broader opening portion 116-1, a distance between a stepped portion of the opening portion 116-1 and an edge of the overhang portion 132 can be enlarged. Therefore, a flow of the melted resin 79 into between the overhang portion 132 and the wiring substrate 11-1 and a flow of the melted resin 79 from between the overhang portion 132 and the wiring substrate 11-1 are facilitated more effectively. Accordingly, the advantageous effect of preventing generation of voids can be enhanced.

Third Exemplary Embodiment

Figure 11:
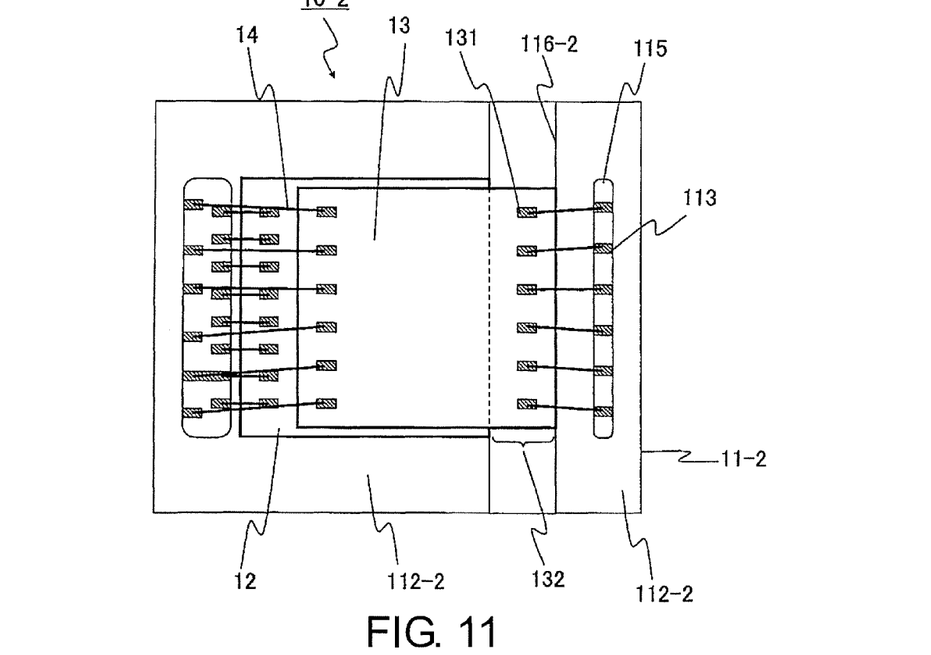
FIG. 11 is a plan view schematically showing a semiconductor device according to a third embodiment of the present invention.
Figure 12:
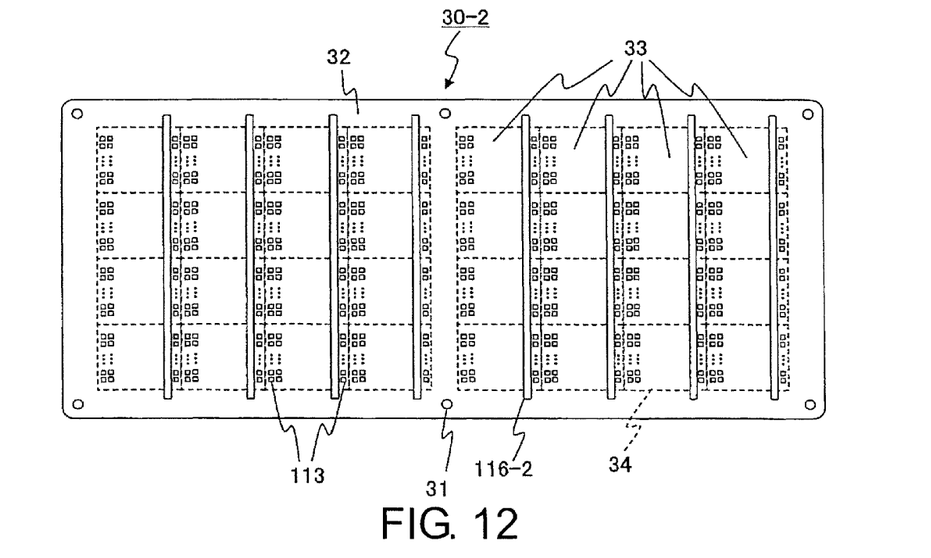
FIG. 12 is a plan view schematically showing a base wiring substrate used to manufacture the semiconductor device shown in FIG. 11.

FIG. 11 is a cross-sectional view schematically showing a semiconductor device 10-2 according to a third exemplary embodiment of the present invention. FIG. 12 is a plan view showing a base wiring substrate 30-2 used to manufacture the semiconductor device 10-2.

The semiconductor device 10-2 has substantially the same configuration as the semiconductor device 10 of the first embodiment. However, the semiconductor device 10-2 differs from the semiconductor device 10 of the first embodiment in that an insulating film 112-2 of a wiring substrate 11-2 has an opening portion 116-2 extending from one side to another side of the wiring substrate 11-2 along a direction parallel to the side of the first semiconductor chip 12 that is adjacent to the opening portion 116-2 (the direction of injection of the sealing resin 15, i.e., the longitudinal direction of FIG. 11).

As can be seen from FIG. 12, opening portions 116-2 are formed on the base wiring substrate 30-2 used for manufacturing semiconductor devices 10-2 so as to extend over a plurality of product formation portions 33 along a direction from gates of a mold used in the molding process toward an air vent (the longitudinal direction of FIG. 12). Accordingly, the melted resin 79 can readily flow along the opening portion 116-2, can satisfactorily flow into between the overhang portions 132 and the base wiring substrate 30-2, and can satisfactorily flow from between the overhang portions 132 and the base wiring substrate 30-2. Therefore, the advantageous effect of preventing generation of voids between the overhang portions 132 and the base wiring substrate 30-2 can further be enhanced.

Fourth Exemplary Embodiment

Figure 13:
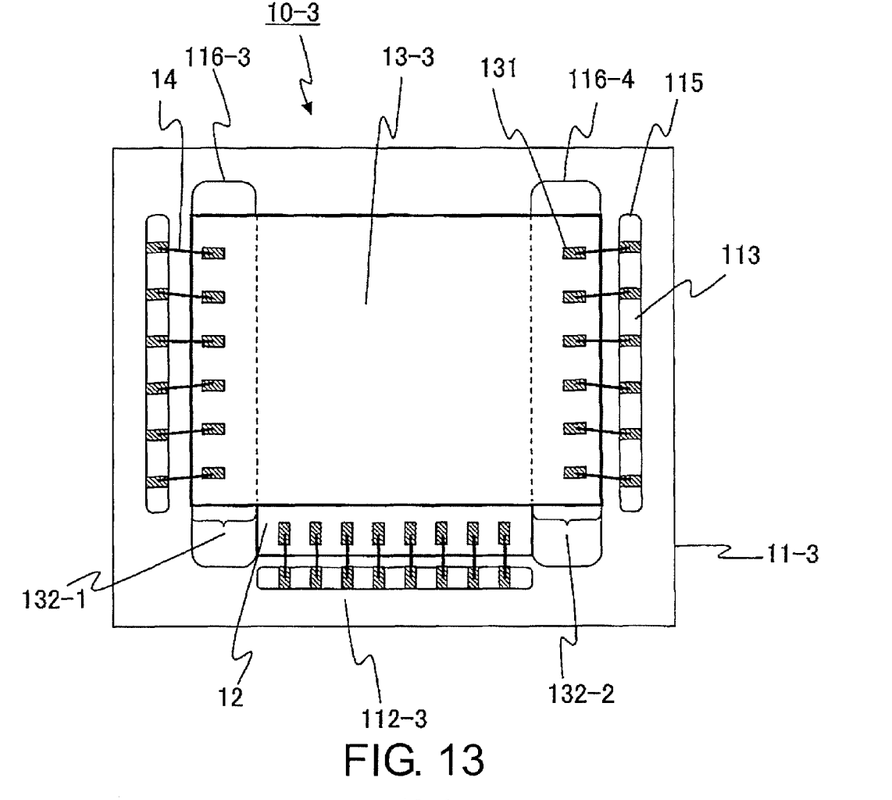
FIG. 13 is a plan view schematically showing a semiconductor device according to a fourth embodiment of the present invention.

FIG. 13 is a plan view schematically showing a semiconductor device 10-3 according to a fourth exemplary embodiment of the present invention.

In this semiconductor device 10-3, a second semiconductor chip 13-3 is stacked and mounted on the first semiconductor chip 12 so as to form two overhang portions 132-1 and 132-2 projecting along a direction substantially perpendicular to two sides of the first semiconductor chip 12 that are substantially parallel to each other (projecting leftward and rightward in FIG. 13). The directions in which those two overhang portions 132-1 and 132-2 project are perpendicular to the direction of injection of the sealing resin 15.

An insulating film 112-3 of a wiring substrate 11-3 is not provided (or has been removed) right below the overhang portion 132-1 or 132-2. Opening portions 116-3 and 116-4 that face the overhang portions 132-1 and 132-2 are larger than the overhang portions 132-1 and 132-2 in the direction of injection of the sealing resin 15.

In the present embodiment, the melted resin 79 has a high fluidity in gaps between the overhang portions 132-1 and 132-2 and the wiring substrate 11-3. Therefore, generation of voids is prevented. Furthermore, an increase of the number of the opening portions and an increase of the gross area of the opening portions improve the adhesiveness between the wiring substrate and the sealing resin and also improve the reliability of the semiconductor device.

According to the present invention, an insulating film is removed from an area that faces an overhang portion formed by a semiconductor chip stacked and mounted on a wiring substrate. Therefore, a gap between the overhang portion and the semiconductor wiring substrate can be increased. Thus, the fluidity of a sealing resin can be enhanced in the gap between the overhang portion and the semiconductor wiring substrate, and generation of voids can be prevented.

Although the present invention, which has been made by the inventors, has been described along with some embodiments, the present invention is not limited to those embodiments. It should be understood that many modifications and variations may be made therein without departing from the spirit and scope of the present invention.

Figure 14:
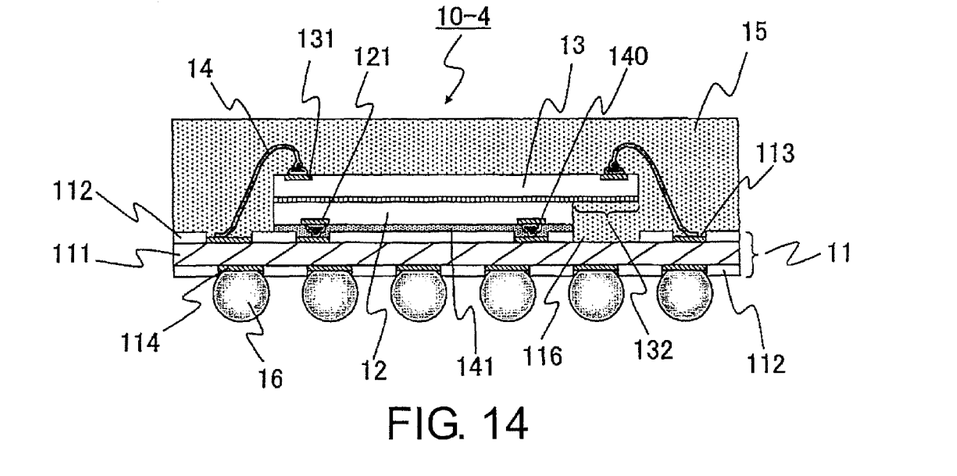
FIG. 14 is a cross-sectional view schematically showing a semiconductor device according to another embodiment of the present invention.

For example, in the above exemplary embodiments, the first semiconductor chip 12 is mounted in a state in which it faces upward. Nevertheless, the first semiconductor chip 12 may be mounted in a state in which it faces downward as shown in FIG. 14. In this case, the electrode pads 121 of the first semiconductor chip 12 and the corresponding connection pads 113 of the wiring substrate 11 can be connected to each other by using bumps 140. Furthermore, an under-filler 141 (or non-conductive paste (NCP)) is filled in a gap between the first semiconductor chip 12 and the wiring substrate 11.

Even though the first semiconductor chip 12 is mounted in a state in which it faces downward, the present invention can be applied as long as the second semiconductor chip 13 projects laterally from the first semiconductor chip 12 so as to form the overhang portion 132.

Furthermore, in the above exemplary embodiments, two semiconductor chips are stacked and mounted on the wiring substrate. Nevertheless, the present invention can be applied to a semiconductor device having three or more semiconductor chips stacked and mounted on a wiring substrate as long as an overhang portion is formed so as to face the wiring substrate.

Moreover, the above exemplary embodiments describe a ball grid array (BGA) type semiconductor device on which solder balls are mounted. Nevertheless, the present invention is applicable to a land grid array (LGA) type semiconductor device.

Furthermore, in the above exemplary embodiments, the semiconductor device has a wiring substrate including a glass epoxy substrate. Nevertheless, the present invention can be applied to a semiconductor device having a flexible wiring substrate including a polyimide substrate.

EXAMPLES

An example 1 describes a method of manufacturing a semiconductor device, comprising:

forming an insulating film on an entire surface of a wiring substrate;

partially removing the insulating film from a predetermined area;

mounting a first semiconductor chip over the wiring substrate so that the first semiconductor chip is adjacent to the predetermined area;

stacking and mounting a second semiconductor chip on the first semiconductor chip so that part of the second semiconductor chip projects from the first semiconductor chip and faces at least part of the predetermined area; and sealing the first semiconductor chip and the second semiconductor chip on the wiring substrate in a sealing resin.

An example 2 describes the method of manufacturing a semiconductor device as recited in the example 1, wherein the sealing resin is injected along a direction parallel to a side of the first semiconductor chip that is adjacent to the predetermined area.

An example 3 describes the method of manufacturing a semiconductor device as recited in the example 1, wherein the predetermined area is larger than an area that faces the part of the second semiconductor chip.

An example 4 describes the method of manufacturing a semiconductor device as recited in the example 3, wherein the predetermined area is larger than an area facing the part of the second semiconductor chip, in a direction parallel to a side of the first semiconductor chip that is adjacent to the predetermined area.

An example 5 describes the method of manufacturing a semiconductor device as recited in the example 4, wherein the predetermined area is larger than the area that faces the part of the second semiconductor chip, in a direction perpendicular to the side of the first semiconductor chip that is adjacent to the predetermined area.

An example 6 describes the method of manufacturing a semiconductor device as recited in the example 4, wherein the predetermined area extends from one side to another side of the wiring substrate in the direction parallel to the side of the first semiconductor chip that is adjacent to the predetermined area.

An example 7 describes the method of manufacturing a semiconductor device as recited in the example 1, further comprising:

preparing a base wiring substrate in which a plurality of product formation portions each constituting the wiring substrate are arranged.

What is claimed is:

1. A semiconductor device, comprising:
    a wiring substrate comprising a substrate and an insulating film formed on a surface of the substrate;
    a first semiconductor chip mounted over the wiring substrate, the insulating film being between the substrate and the first semiconductor chip;
    a second semiconductor chip stacked on the first semiconductor chip so as to form an overhang portion; and
    an opening formed in the insulating film to expose the substrate of the wiring substrate,
    wherein the opening is surrounded by the insulating film, and the overhang portion of the second semiconductor chip is vertically aligned with the opening of the insulating film.

2. The semiconductor device as recited in claim 1, wherein the opening is larger in size than the overhang portion of the second semiconductor chip.

3. The semiconductor device as recited in claim 1, wherein a direction in which the overhang portion projects is perpendicular to a side of the first semiconductor chip.

4. The semiconductor device as recited in claim 3, wherein two overhang portions are formed so as to project along a direction perpendicular to two sides of the first semiconductor chip that are parallel to each other from the two sides of the first semiconductor chip, and
    the insulating film includes two openings that expose the substrate, and
    each of the two overhang portions are vertically aligned with a corresponding one of the two openings.

5. The semiconductor device as recited in claim 1, wherein the wiring substrate includes a connection pad formed on the substrate, and the insulating film includes a second opening to expose the connection pad,
    the second semiconductor chip includes a first main surface facing to the wiring substrate, a second main surface opposite to the first main surface and an electrode pad formed on the second main surface, and the electrode pad is vertically aligned with the opening of the insulating film.

6. The semiconductor device as recited in claim 5, wherein the second opening is arranged at a location in which the opening is sandwiched between the first semiconductor chip and the location in plan view, and the electrode pad of the second semiconductor chip is electrically connected to the connection pad of the wiring substrate via a bonding wire.

7. The semiconductor device as recited in claim 5, wherein the first semiconductor chip includes a third main surface facing to the wiring substrate and a second electrode pad formed on the third main surface.

8. A semiconductor device comprising:
  a wiring substrate including a first surface and a recess that is formed on the first surface, a part of the wiring substrate on which the recess is formed is thinner than a periphery part of the wiring substrate;
  a first semiconductor chip that is mounted over the first surface of the wiring substrate so that an edge of the first semiconductor chip is positioned adjacent to the recess; and
  a second semiconductor chip stacked over the first semiconductor chip so as to form a overhang portion that extends from the edge of the first semiconductor chip,
  wherein the second semiconductor chip includes a first main surface facing to the wiring substrate, a second main surface opposite to the first main surface and an electrode pad formed on the second main surface, the electrode pad being vertically aligned with the recess of the substrate.

9. The semiconductor device as recited in claim 8, wherein the overhang part of the second semiconductor chip is approximately equal in size to the recess of the wiring substrate.

10. The semiconductor device as recited in claim 8, wherein the overhang part of the second semiconductor chip is vertically aligned with the recess of the wiring substrate.

11. The semiconductor device as recited in claim 8, wherein the recess of the wiring substrate is larger in size than the overhang part of the second semiconductor chip.

12. The semiconductor device as recited in claim 8, wherein the wiring substrate includes a substrate and an insulating film that is formed on the substrate, and
  the recess is formed in the insulating film to expose a surface of the substrate.

13. The semiconductor device as recited in claim 8, further comprising:
  a sealing resin that is formed on the first surface of the wiring substrate to cover the first semiconductor chip and the second semiconductor chip, the recess being filled with the sealing resin.

14. The semiconductor device as recited in claim 8, wherein the recess is formed in parallel with a first edge of the wiring substrate, and formed continuously from a second edge of the wiring substrate perpendicular to the first edge to a third edge of the wiring substrate perpendicular to the first edge.

15. The semiconductor device as recited in claim 8, wherein the wiring substrate includes a second recess formed on the first surface and a connection pad formed in the second recess, the second recess is arranged at a location in which the recess is sandwiched between the first semiconductor chip and the location in plan view, and the connection pad is electrically connected to the electrode pad of the second semiconductor chip.

16. The semiconductor device as recited in claim 15, wherein the first semiconductor chip includes a third main surface facing to the wiring substrate and a second electrode pad formed on the third main surface.

17. A semiconductor device comprising:
  a wiring substrate comprising a substrate and an insulating film formed on the substrate, the insulating film including first and second openings that are apart from each other, the wiring substrate including a plurality of connection pads formed on the substrate so that the plurality of connection pads are exposed from the insulating film by the first opening;
  a first semiconductor chip mounted over the wiring substrate, the first semiconductor chip being arranged at a location in which the second opening is sandwiched between the first opening and the location in plan view, and the insulating film being between the substrate and the first semiconductor chip; and
  a second semiconductor chip stacked over the first semiconductor chip so that a part of the second semiconductor chip is vertically aligned with the second opening of the insulating film.

18. The semiconductor device as recited in claim 17, wherein the second opening of the insulating layer is larger in size than the part of the second semiconductor chip.

19. The semiconductor device as recited in claim 17, wherein the second opening extends to an edge of the substrate of the wiring substrate.

20. The semiconductor device as recited in claim 17, wherein the second semiconductor chip includes a first main surface facing to the wiring substrate, a second main surface opposite to the first main surface and a plurality of electrode pads formed on the second main surface, the electrode pads being vertically aligned with the second opening, and each of the electrode pads being electrically connected to the connection pads via a bonding wire.

* * * * *